(12) United States Patent
Wolterink et al.

(10) Patent No.: US 7,564,496 B2
(45) Date of Patent: Jul. 21, 2009

(54) CAMERA DEVICE, METHOD OF MANUFACTURING A CAMERA DEVICE, WAFER SCALE PACKAGE

(75) Inventors: Edwin Maria Wolterink, Eindhoven (NL); Gerardus Maria Dohmen, Eindhoven (NL); Aloysius Franciscus Maria Sander, Eindhoven (NL); Arjen Gerben Van der Sijde, Eindhoven (NL); Leendert De Bruin, Eindhoven (NL); Erik Harold Groot, Eindhoven (NL); Anton Petrus Maria Van Arendonk, Eindhoven (NL)

(73) Assignee: Anteryon B.V. (NL)

( * ) Notice: Subject to any disclaimer, the term of this patent is extended or adjusted under 35 U.S.C. 154(b) by 171 days.

(21) Appl. No.: 10/527,778

(22) PCT Filed: Sep. 16, 2003

(86) PCT No.: PCT/IB03/03920

§ 371 (c)(1), (2), (4) Date: Mar. 14, 2005

(87) PCT Pub. No.: WO2004/027880

PCT Pub. Date: Apr. 1, 2004

(65) Prior Publication Data
US 2006/0044450 A1      Mar. 2, 2006

(30) Foreign Application Priority Data

Sep. 17, 2002 (EP) ................................. 02078852
Oct. 1, 2002 (EP) ................................. 02079106
Oct. 1, 2002 (EP) ................................. 02079107

(51) Int. Cl.
*H04N 5/225* (2006.01)
*H01L 29/78* (2006.01)
*H01L 21/00* (2006.01)

(52) U.S. Cl. .................. 348/340; 257/432; 438/118
(58) Field of Classification Search .............. 348/340, 348/335; 438/65, 118; 257/432
See application file for complete search history.

(56) References Cited

U.S. PATENT DOCUMENTS 5,502,381 A * 3/1996 Saitou ..................... 324/209

(Continued)

FOREIGN PATENT DOCUMENTS

EP     1239519 A2     9/2002

OTHER PUBLICATIONS

JP-2002139662A May 17, 2002, Konica Corp. (Abstract).

*Primary Examiner*—Nhan T Tran
(74) *Attorney, Agent, or Firm*—Wood Phillips Katz Clark & Mortimer

(57) ABSTRACT

The invention relates to a camera device and a method for manufacturing such a device. The camera device comprises an image capturing element, a lens element for imaging an object at the image capturing element and a spacer means for maintaining a predetermined distance along the main optical axis though the lens and the image capturing element, and lens substrate for carrying the lens wherein the spacer means comprises an adhesive layer. This enables a mass manufacturing process wherein parts of the individual camera elements can be manufactured in manifold on different substrates, after which the different substrates are stacked, aligned and joined via adhesive layers. In the manufacturing process the different distances between the plates and the wafers are adjusted and maintained via the spacer means comprising the adhesive layers. From the stack individual camera devices are sawn out.

16 Claims, 10 Drawing Sheets

U.S. PATENT DOCUMENTS

| | | | |
|---|---|---|---|
| 5,617,131 A * | 4/1997 | Murano et al. | 250/208.1 |
| 5,981,945 A | 11/1999 | Spaeth | |
| 6,072,634 A * | 6/2000 | Broome et al. | 359/637 |
| 6,285,064 B1 | 9/2001 | Foster | |
| 2004/0012698 A1 * | 1/2004 | Suda et al. | 348/315 |

* cited by examiner

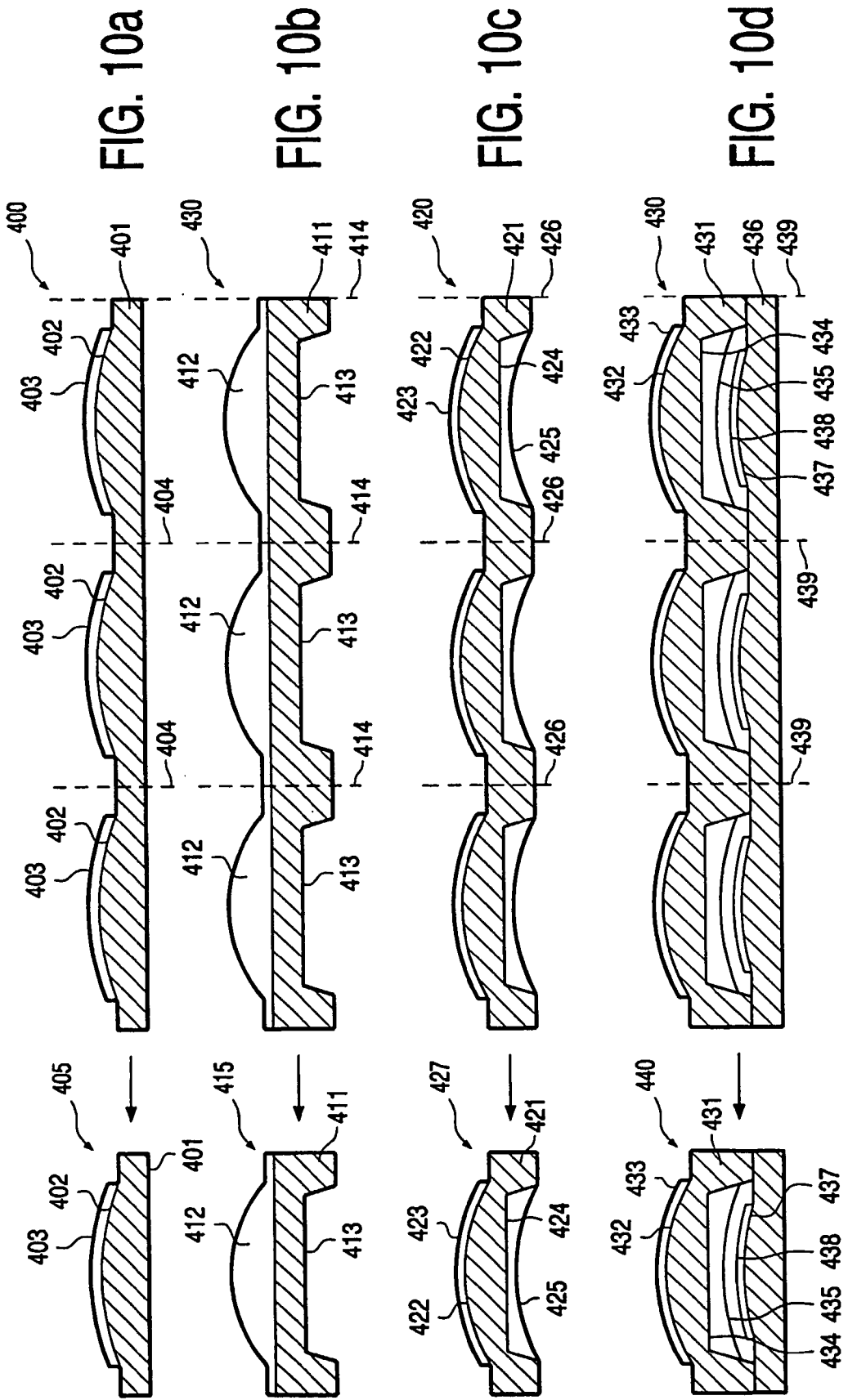

CAMERA DEVICE, METHOD OF MANUFACTURING A CAMERA DEVICE, WAFER SCALE PACKAGE

CROSS-REFERENCE TO RELATED APPLICATION

This application claims priority from PCT International Application No. PCT/IB2003/003920, having an International filing date of Sep. 16, 2003.

BACKGROUND OF THE INVENTION

The invention relates to a camera device comprising an image capturing element, a lens element for projecting an object on the image capturing element, a spacer means for maintaining a predetermined distance between the lens and the image capturing element, and a lens substrate for carrying the lens.

The invention also relates to a method for manufacturing a camera device, a wafer scale package comprising a base substrate having a plurality of image capturing elements, and an optical assembly for use in a process for manufacturing a camera device.

Camera devices of this type are used in, for instance small portable devices such as mobile telephones, personal digital assistants (PDAs) and laptop computers.

A camera device as mentioned in the opening paragraph is disclosed in the Japanese patent application published under number JP-2002/139662. The known camera device comprises an image pick-up element mounted on a substrate, and a lens support carrying one or more lenses. The lens support is integrally formed with the lens and is fastened to the image pick-up element whereby the lens support takes care of an accurate position in the direction of a main optical axis through the lenses on the image pick-up element. In a manufacturing process the individual image pick-up element, lens support, and lens are stacked and joined together. In order to obtain a high-quality image of an object on the image pick-up element, the dimensions of the lens support in the direction of the main optical axis should have a high accuracy. Furthermore positioning of these parts relative to each other should be accurate.

BRIEF SUMMARY OF THE INVENTION

A disadvantage of the known camera device is that the manufacturing process each lens support has to be adjusted separately relative to the image pick-up element in each camera device, so there is little possibility to manufacture the known camera device in an efficient mass production process while maintaining a high positioning accuracy.

It is inter alia an object of the invention to provide a camera device of the type mentioned in the opening paragraph, having an increased capability for an efficient mass manufacturing process with a high positioning accuracy.

To this end the invention provides camera device as defined in the opening paragraph which is characterized in that the spacer means comprises an adhesive layer.

In this arrangement the lens substrate including the lens element and the spacer means comprising the adhesive layer, can be positioned and aligned along the main optical axis through the lens element and the image capturing element, after which a predetermined distance is set between the lens element and the image capturing device. After hardening the adhesive layer this predetermined distance is maintained by the spacer means. This arrangement provides increased capabilities for mass manufacturing wherein a plurality of image capturing elements, lens elements and spacer means can be manufactured on a base substrate comprising the imaging elements and a lens substrate respectively, whereby the base substrate and the lens substrate are stacked and joined with a high accuracy and the individual camera devices are separated from the stack. The hardening of the adhesive layer can be performed in case of an ultra-violet curable adhesive by UV radiation or in case of a thermo-hardening adhesive by heating the adhesive layer.

U.S. Pat. No. 6,285,064 introduces a wafer scale package for solid state image sensor integrated circuits, whereby arrays of micro lenses are placed on top of a wafer having the image sensors formed thereon. An adhesive matrix is placed atop of the wafer. The adhesive matrix has openings that align with the micro lens arrays on top of the wafer. A cover glass is then placed over the adhesive and the adhesive is activated to secure the cover glass to the wafer. Because the adhesive has openings above the micro lensed portion distortion or reduction of the lens effect by the adhesive shall be avoided.

It is a further object of the invention to provide a method for an efficient mass production process of a camera device. This object is achieved by a method for manufacturing a camera device, characterized by the steps of
- providing a lens substrate comprising a plurality of lens elements, the lens substrate comprising an adhesive layer;
- stacking the lens substrate and a base substrate comprising a plurality of image capturing elements;
- aligning the lens substrate and the base substrate along main optical axes through respective lens elements and associated image capturing elements;
- setting the distance between the lens elements and the associated image capturing elements along the main optical axes through the lens elements and the associated image capturing elements;
- hardening the adhesive layer; and
- separating camera devices from the stack of the lens substrate and the base substrate.

In this process the camera devices are manufactured by stacking a lens substrate comprising a plurality of lens elements, spacer means in the form of a spacer substrate and a base substrate containing a plurality of image capturing elements. The predetermined distances along the optical axis through the individual lens elements and the associated image capturing elements between the different substrates can be accurately adjusted after the stacking of the substrates and maintained by hardening of the adhesive layer between the different substrates. After completing the stack, the individual camera devices can be separated from the stack. This process yields relatively cheap camera devices which are suitable for use in small electronic equipment, such as mobile phones and personal digital assistants.

It is a further object of the invention to provide a wafer scale package for an efficient mass production of a camera device. This object is achieved by a wafer scale package comprising a base substrate having a plurality of image capturing elements, characterized in that it further comprises a lens substrate having a plurality of lens elements associated with respective image capturing elements, and a spacer means for maintaining a predetermined distance between the lens substrate and the base substrate, whereby the position of the lens substrate relative to the base substrate is fixated by means of an adhesive layer.

In this wafer scale package the lenses are already aligned relative to the corresponding image capturing elements and the distance between the lenses and the corresponding image capturing elements is accurately adjusted. In this way it is not required to position individual lens elements relative to corresponding individual image capturing elements, thereby simplifying the manufacturing of camera devices.

It is a further object of the invention to provide an optical assembly for an efficient mass production of a camera device. This object is achieved by An optical assembly for use in a process for manufacturing a camera device according to the invention, characterized in that it comprises a lens substrate having a plurality of lens elements.

By stacking the optical assembly and a base substrate comprising a image capturing elements corresponding to the plurality of lens elements it is possible to position the lens elements relatively to the image capturing elements for all lens elements simultaneously. In this way it is not necessary to position individual lens elements relative to individual image capturing elements in a later stage of production.

Preferably the optical assembly has area dimensions corresponding to the area dimensions of the base substrate comprising the image capturing elements.

In embodiments the adhesive layer comprises an ultra-violet curing resin or a thermo-hardening resin.

In a further embodiment the adhesive layer has the shape of a rim situated outside the projection of the hole on the spacer means, co-axially positioned with the main optical axis of the lens element. In this way, no adhesive material is in the optical path between the lens element and the image capturing element.

In a further embodiment the spacer means comprises a cover substrate and a spacer substrate. The cover substrate protects the image capturing element against possible damage during further manufacturing process steps.

In a further embodiment the spacer substrate comprises a hole coaxially positioned relative to a main optical axis of the lens element whereby the side of the hole is provided with an anti-reflection layer. This arrangement reduces reflection within the camera device, thereby enhancing its performance.

In a further embodiment the adhesive layer can be provided between the image capturing element and the spacer substrate; and also between the spacer substrate and the cover substrate. This arrangement enables accurate adjustment after each separate step of stacking.

In a further embodiment the lens element is of a replication type. These replication type lenses enable manufacturing of high quality lenses at low costs. Suitable materials for manufacturing replication type lenses are in principle all monomers with a group that can be polymerized.

In a further embodiment the lens element is formed as a convexity in the lens substrate. This simplifies the manufacturing of the lens elements.

In a further embodiment the lens element is formed as a concavity in the lens substrate. In this arrangement the lens substrate can be part of the spacer means. In this way larger distances between the lens and the image capturing element can be obtained by increasing the thickness of the lens substrate, without increasing the complexity of the manufacturing process by introducing a separate spacer substrate.

In a further embodiment the lens substrate is provided with a through hole whereby the lens element is located within the through hole. In this way more flexibility is provided in the shape of the lens and in the distance between the lens and the image capturing element.

In a further embodiment the lens substrate is provided with an infra-red reflection layer. Solid state image capturing elements are sensitive to infra-red radiation. By cutting off this infra-red range of the spectrum, the sensitivity of the camera device for infra-red radiation is reduced.

In a further embodiment the lens substrate is provided with an anti-reflection layer. This arrangement avoids reflection in the camera device.

These and other aspects of the invention are apparent from and will be elucidated with reference to the embodiments described hereinafter.

BRIEF DESCRIPTION OF THE SEVERAL VIEWS OF THE DRAWINGS

In the drawings:

FIGS. 10a to 10d show, in slice planes, further embodiments of an optical assembly according to the invention.

The Figures are schematic and not drawn to scale, and, in general, like reference numerals refer to like parts.

DETAILED DESCRIPTION OF THE INVENTION

Figure 1:
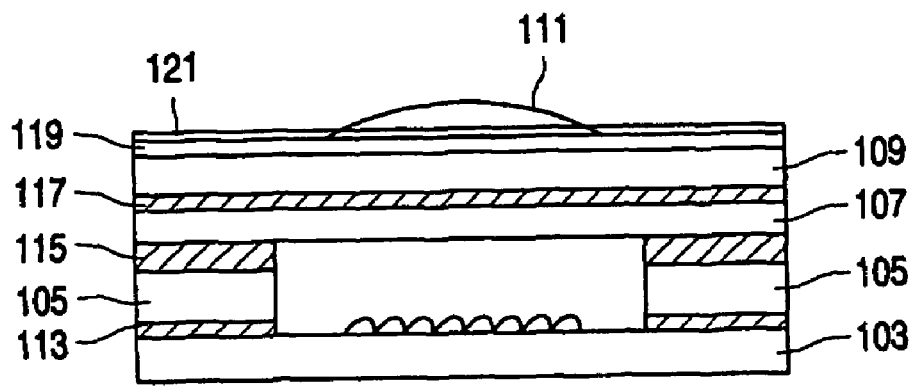
FIG. 1 is a cross-sectional view of a first embodiment of a camera device.

FIG. 1 schematically shows a first embodiment of a camera device. The camera device 101 comprises an image capturing element 103, a micro spacer plate 105 glued to the image capturing element, a cover plate 107 glued to the micro spacer plate 105 and a lens substrate 109 provided with a lens 111. The image capturing element is a Charge Coupled imaging Device (CCD) or a CMOS imaging device. In general such an image capturing element is referred to as a solid-state image sensor (SSIS). The micro spacer plate 105 is provided with a hole for passing image forming light rays from the lens element 111 to the image capturing element 103. Preferably, an infra-red reflection coating 119 is provided between the lens substrate 109 and the cover plate 107; and an anti-reflex coating 121 is provided over the lens substrate 109 and the lens element 111. A first adhesive layer 113 of approximately 10 μm thickness is present between the micro space plate 105 and the image capturing element 103. A second adhesive layer 115 of approximately 100 μm thickness is present between the cover plate 107 and the micro spacer plate 105 and a third adhesive layer 117 of approximately 10 μm thickness is present between the lens substrate 109 and the cover plate 107. Preferably, the adhesive layers 113, 115, 117 are rim-shaped, the adhesive material being present outside an area coinciding with the projection of the circumference of the lens element 111 on the surfaces of the micro-spacer plate 105 and the cover plate 107.

The thickness of the micro-space plate 105 is for example 0.4 mm. The thickness of the cover plate is 0.4 mm and the thickness of the lens substrate plate is for example 0.4 mm. Each adhesive layer 113, 115, 117 maintains the distance between the different plates to a predetermined distance with an accuracy of typically 5 μm. In the camera device 101 the spacer means is thus formed by the micro-spacer plate 105, the cover plate 107 and the adhesive layers 113, 115, 117.

To prevent ghost imaging on the image capturing element 103 it may be advantageous to provide an anti-reflection layer on the side wall of the micro-spacer plate 105, thereby by preventing unwanted reflections of light within the camera device 101. Such an anti-reflection layer can be provided for instance by coating the side wall of the micro-spacer plate 105 with a low reflecting material, for instance with black resist. The coating may be applied by means of spraying.

Figure 2:
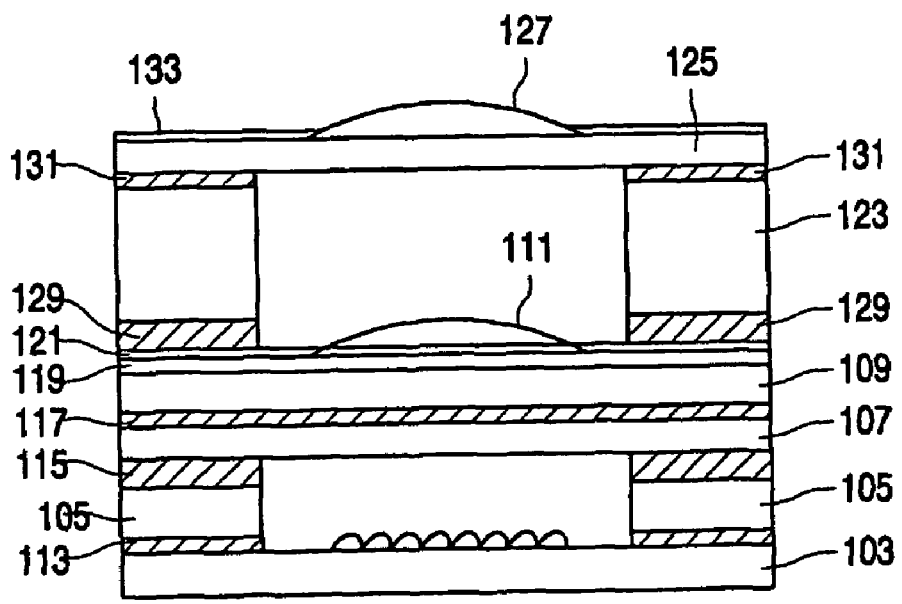
FIG. 2 is a cross-sectional view of a second embodiment of a camera device.

FIG. 2 shows a second embodiment of a camera device. This camera device 110 comprises an optical system of two lens elements 111, 127. An advantage of the two-lens optical systems is that a relatively strong lens operation is obtained without much aberrations.

Parts in FIG. 2 assigned the same number as in FIG. 1 correspond to the same elements. Furthermore, FIG. 2 shows a second lens substrate 125 stacked on a second spacer place 123 and the first lens substrate 109 respectively, aligned along the main optical axis through the second lens element 127, the first lens element 111 and the image capturing element 103 and joined by adhesive layers 129, 131. Preferably, a diaphragm 133 is formed from an aluminum layer provided with a hole co-axially positioned with the main optical axis of the lenses 111, 127.

To prevent ghost imaging on the image capturing element 103 it may be advantageous to provide an anti-reflection layer on the side wall of the micro-spacer plate 105 and/or on the side wall of the second spacer plate 123, thereby by preventing unwanted reflections of light within the camera device 110.

Figure 3:
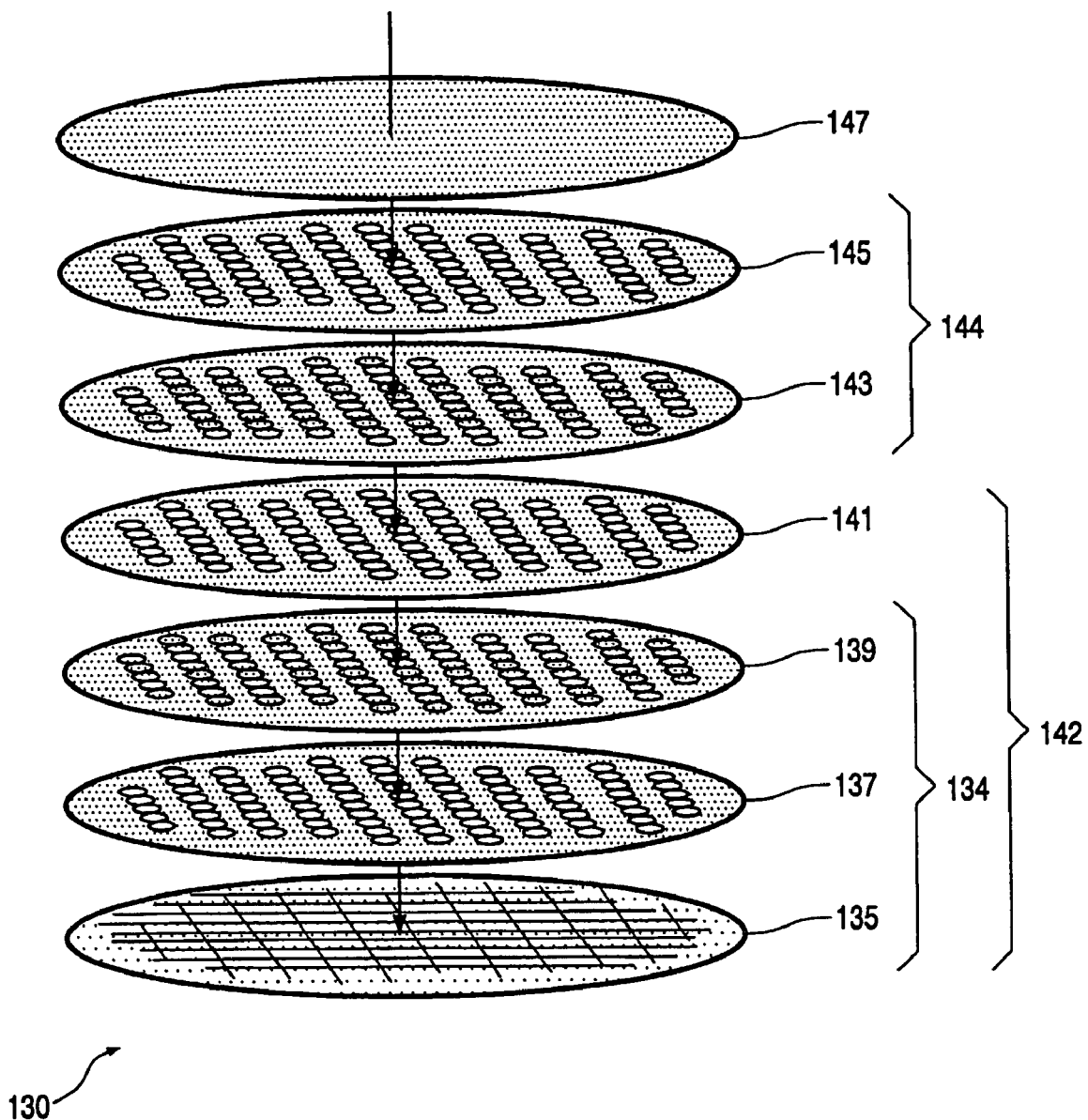
FIG. 3 shows a stack of wafer plates obtained after several successive manufacturing steps, of the camera device before dicing out the camera devices.

A manufacturing method for these camera devices comprises wafer scale manufacturing steps because multiple image capturing elements are manufactured and obtained on a substrate, for example, a silicon wafer of approximately 20.32 cm diameter (8"). Also the spacer means and lens elements can be manufactured in manifold on substrates. FIG. 3 shows an exploded view of a stack of substrates before the individual camera devices 110 are diced out. This stack 130 comprises a base substrate 134 comprising the silicon wafer 135 containing image capturing elements 103, a micro-spacer wafer 137 containing micro-spacer elements 105, a cover wafer 139 and a first lens substrate 141 containing lenses 109. All these elements are available on a wafer dimension scale. Furthermore, FIG. 3 shows a second spacer wafer 143, a second lens substrate 145 and a further cover wafer 147, necessary to obtain a camera device provided with an optical system of two lenses.

Figure 4:
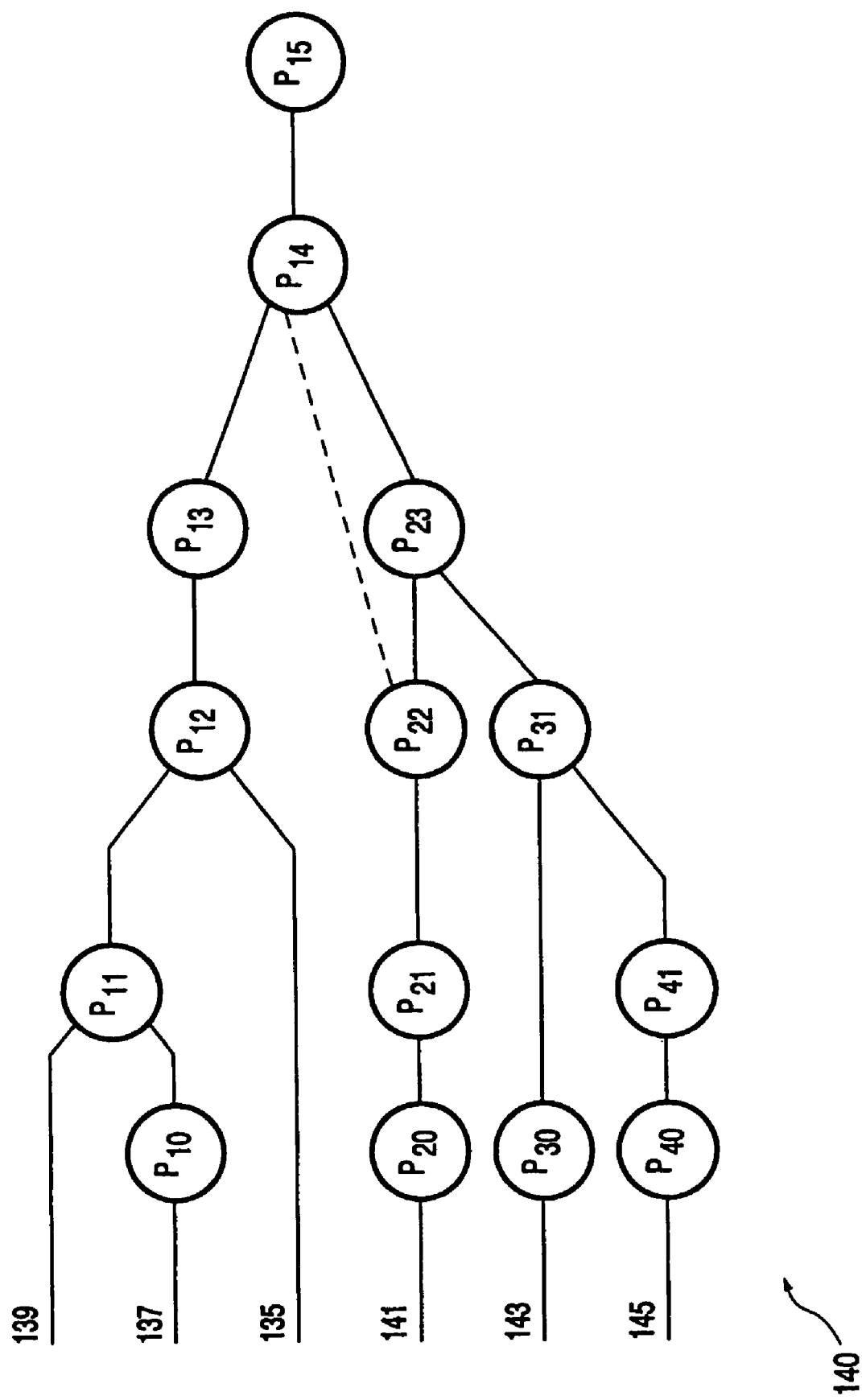
FIG. 4 shows a manufacturing process flow chart of the camera device.

FIG. 4 shows a process flow chart 140 of a method for manufacturing camera devices. In a process step 120 the first lens substrate 141 is manufactured by providing an infra-red coating 119 on a glass substrate, followed by a process step P21 of forming the lens elements 111 on the glass substrate via a conventional replication process. In a further process step P22 the first lens substrate 141 is provided with an anti-reflex coating 121.

The base substrate 134 is manufactured in the following process steps. In a process step P10 a micro-spacer wafer 137 is manufactured by etching holes in a glass substrate of wafer size dimension for example 20.32 cm. Alternatives for etching in this process step P10 are: laser cutting, powder blasting and ultrasonic drilling. All these techniques are well known to a person skilled in the art. In a subsequent step, process step P12, the micro-spacer wafer 137 and the silicon wafer 135 containing the image capturing elements, are provided with an adhesive layer via screen printing, or alternatively, spray coating. The adhesive layer may consist of for example an ultra-violet curable resin. Furthermore, the micro-spacer wafer 137 and the cover wafer 139 are aligned and the distance along the main optical axis between the cover plate wafer the holes of the micro-spacer wafer 137 and the image surface of the associated image capturing elements 103 of the silicon wafer 135 is set to a predetermined value of, for example, 900±5 μm, after which the adhesive layer is cured by ultra-violet radiation. The hardened adhesive layer 115 maintains the adjusted distance. The joined wafers 135, 137, 139 form the base substrate 134 containing the image capturing elements 103.

In a subsequent process step P14 the base substrate 134 and the lens substrate 141 are aligned, set to, a predetermined distance of, for example 10 μm; and joined together via an ultra-violet (UV) curable adhesive layer 117. In a further subsequent step P15 the individual camera devices are separated, for example, by sawing.

In order to obtain a camera device 110 comprising an optical system of two lens elements 111, 127 some further process steps P40, P41 and P31 are required. In process step P30 a second spacer wafer 143 is provided with holes for image forming rays to pass through. In the process step P40 the lenses 127 are formed on the second lens substrate via a replication process. Preferably, in a subsequent process step P41 a diaphragm is provided on the lens 127. The diaphragm is formed by an aluminum layer with a circular hole coaxially positioned relative to the main optical axis of the lens system. In a subsequent joining step P31 the second lens substrate plate 145 and the second spacer wafer 143 are aligned, set to a predetermined distance of for example 1.67 mm; and joined by an ultra-violet curable adhesive layer 131 of approximately 100 μm. In a subsequent process step P23, the sub-assembly of second lens substrate plate 145 and the second spacer plate 143 is aligned, set to a predetermined distance of for example 121 mm to the first lens substrate plate 141, and joined by an ultra-violet curable adhesive layer 129 of 10 μm.

Figure 5:
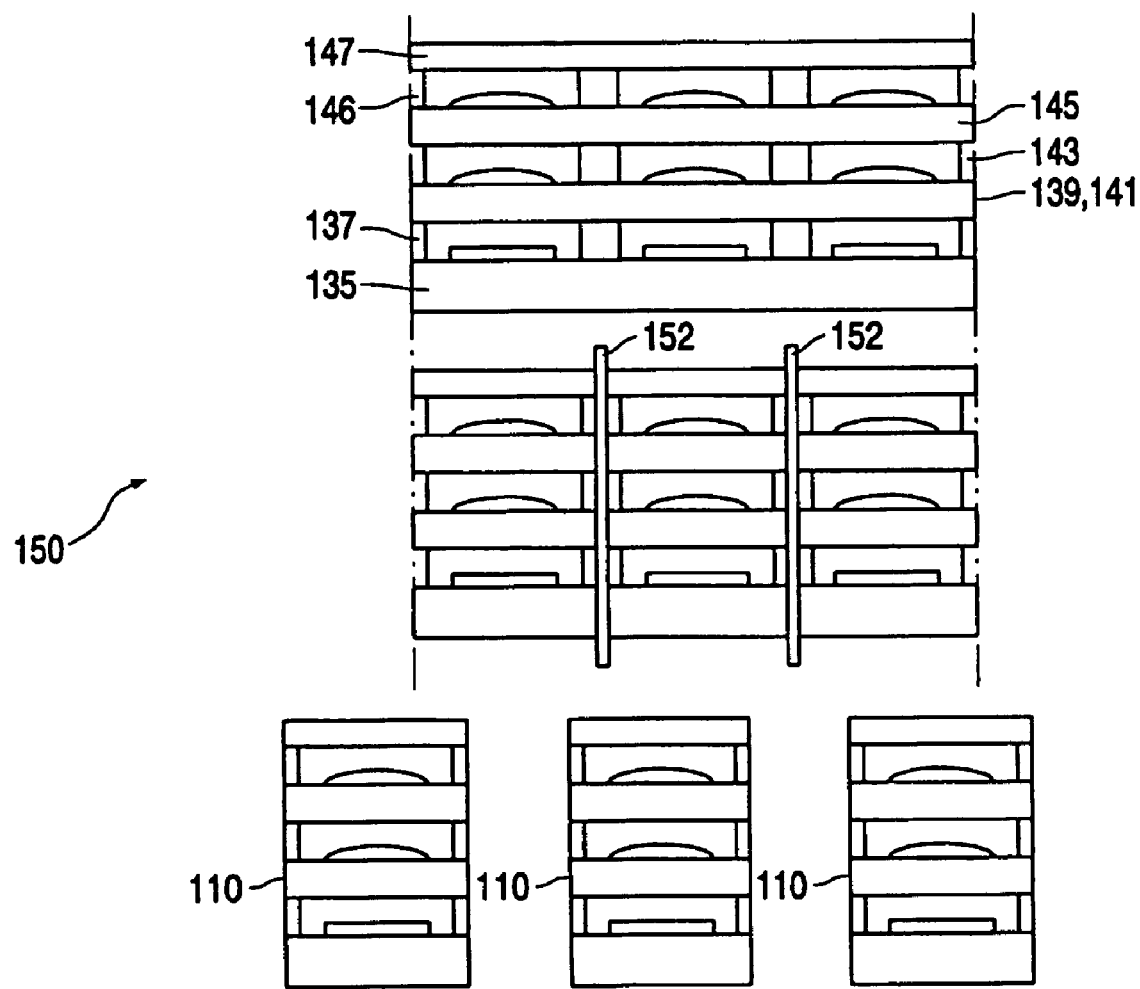
FIG. 5 shows a step of dicing the stack of wafer plates.

In the process step P14 this lens substrate assembly 44 and the base substrate sub-assembly 142 of process step P13 are aligned, set to a predetermined distance and joined by an ultra-violet curable adhesive layer 129. Preferably, in this process step a third spacer plate 146 and a second cover plate 147 are stacked on the second lens substrate 145 by an ultra-violet curable layer. In a separating step P15 the camera devices 110 are sawn out, or separated in another known way, of the assembled stack 150 as diagrammatically shown in FIG. 5. The assembled stack 150 is sawn via a dicing lane 152. The width of the dicing lane is for example approximately 230 μm. It may be advantageous to apply a thermo-hardening adhesive instead of a ultra-violet curing adhesive.

It will be obvious that many variations are possible within the scope of the invention without departing from the scope of the appended claims.

In FIGS. 6a to 6d are shown, in slice planes, different arrangements for a wafer scale package comprising solid state image sensors (SSIS), according to the principle of the present invention. All through the FIGS. 6a to 6d there is a silicon wafer 211, comprising an array of SSIS dies (not illustrated in FIGS. 6a to 6d) and a covering glass layer 231, preferable made of an IR glass. For better illustration, there is only shown a section of the whole wafer, which is indicated by the dotted line L on the left side of each FIG. 6a to 6d. It will be noted that within the arrangement of the silicon wafer 211 and the glass layer 231, micro lenses may be attached to the photosensitive area of the SSIS dies. As to the performance of the camera devices that are obtained by separating the wafer scale package, this will be referred to in FIGS. 7a to 7d.

Figure 6A:
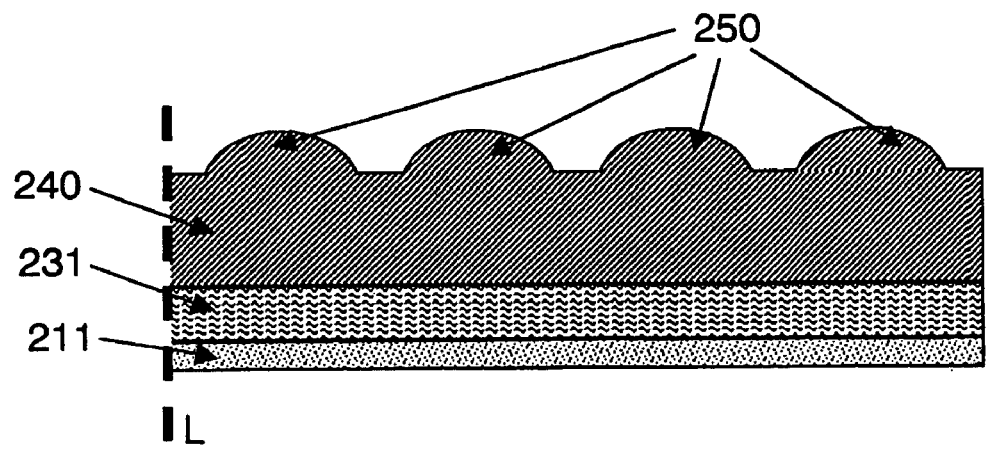
FIGS. 6a to 6d show, in slice planes, different arrangements for a wafer scale package comprising solid-state image sensors, according to the principle of the present invention.
Figure 6B:
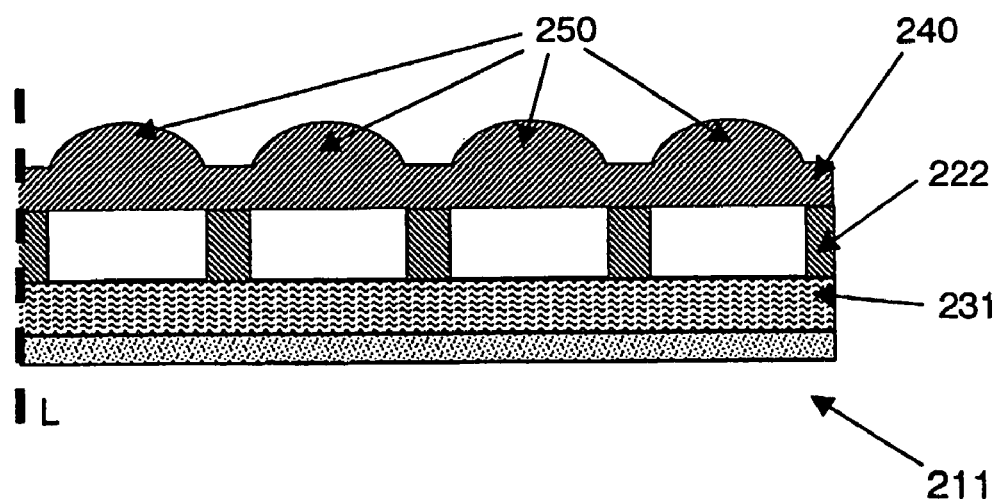
Figure 6C:
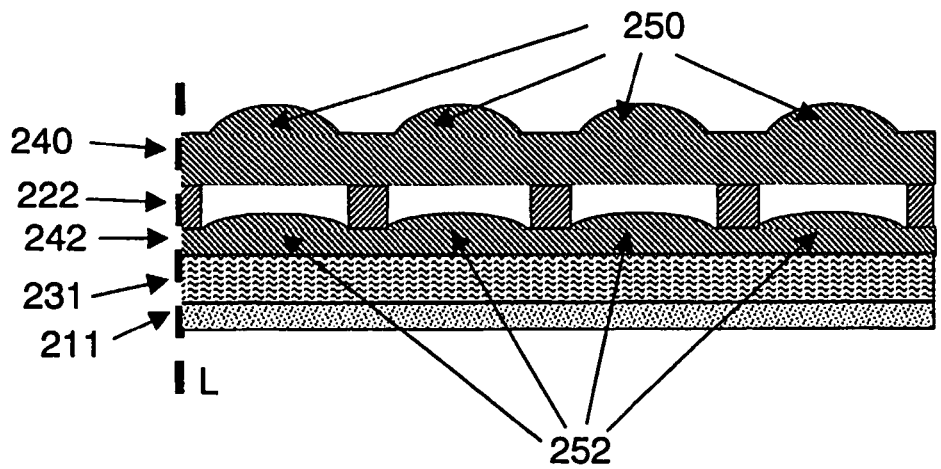
Figure 6D:
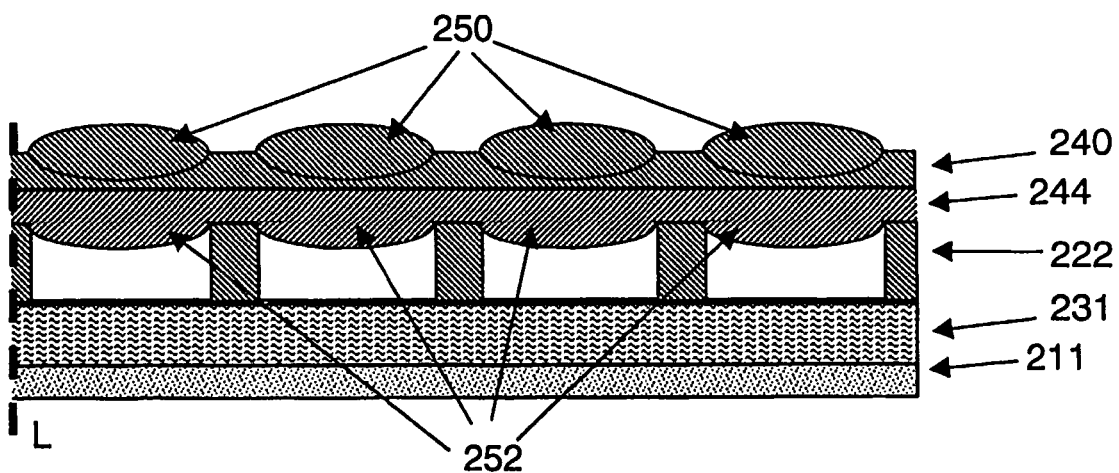

The wafer scale package in FIG. 6a only comprises a first glass layer 231 and a second glass layer providing convex lenses 250 orientated away from surface of the silicon wafer 211. In FIG. 6b there is the only change in comparison to FIG. 6a that a spacer layer 222 has been inserted between a first transparent layer 231 and a second transparent layer 240 containing the lenses 250. As to FIG. 2c, there is a further minor change with respect to FIG. 6b, here an additional glass layer 242 comprising lenses 52 has been inserted between the spacer layer 222 and the first glass layer 231. In this embodiment, there is an air gap between the two lenses 250, 252 of the wafer scale package. Finally, FIG. 6d shows an arrangement, again in comparison to FIG. 6b, wherein a additional glass layer 244 with lenses 254 is arranged between the spacer layer 222 and the glass layer 240.

Figure 7A:
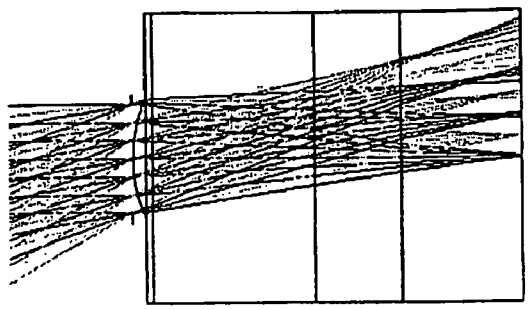
FIGS. 7a to 7d represent simulations of different optical systems for use in a camera device, wafer scale package, or optical module according to the invention.
Figure 7B:
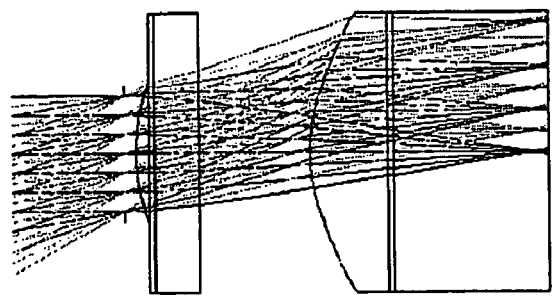
Figure 7C:
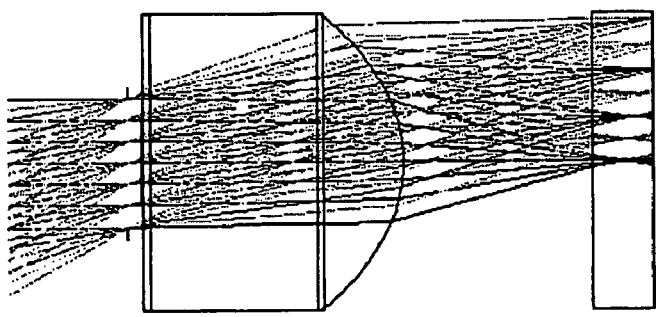
Figure 7D:
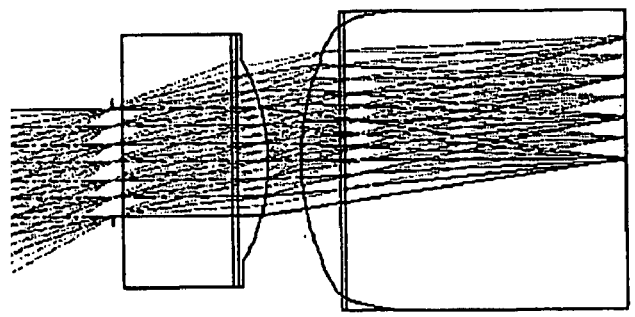

Now reference is made to FIGS. 7a to 7d, here the performance of some examples for camera devices, wafer scale packages, and optical modules according to the present invention are illustrated by way of simulation diagrams. The simulations give results according to performance and dimensions of a camera device according to the present invention. All simulation diagrams read as follows: starting from the left, i.e. the real image which is to be projected by the optical system, there are light rays, which are depicted as lines, going through the optical system and crossing each other behind the optical system. The cross points of these simulated light rays could be connected by a drawing line, this would lead to the ideal image plane wherein the real image would be projected without error. However, since the photosensitive area of an SSIS is flat, the optical system has to be adapted to a flat photosensitive area as image plane. Looking at FIG. 7a shows that an optical system with only one lens has a very curved image plane and therefore, produces increasingly low performance towards the edges of the image plane. FIGS. 7b to 7d display the advantage of a second lens in the optical system, since both lenses work together as to focus and as to flattening of the image plane and thus, the image plane is more adapted to the photosensitive area. The arrangement in FIG. 7b has as an advantage that it is very low in height. This is because of the fact, that a large angle for the traveling light can be used in the air cavity between the two lenses.

Figure 8A:
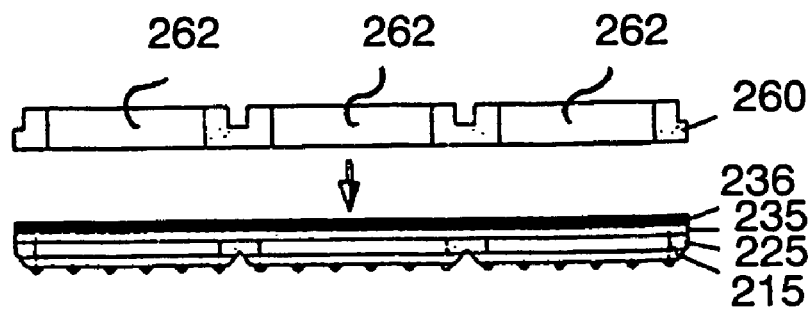
FIGS. 8a to 8e show several steps of the manufacturing of a further embodiment of a camera device according to the invention.
Figure 8B:
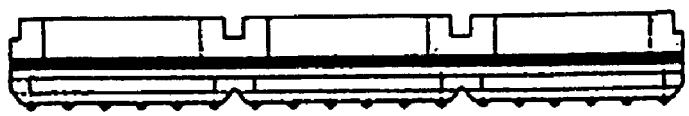
Figure 8C:
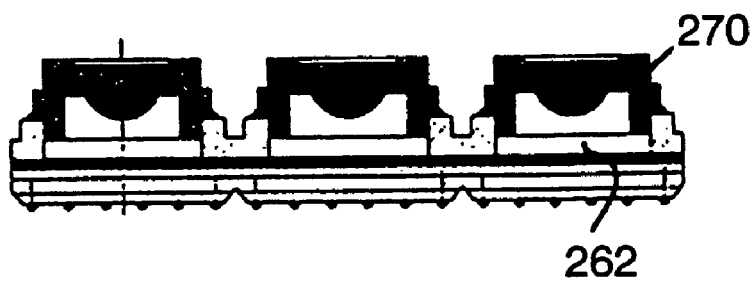
Figure 8D:
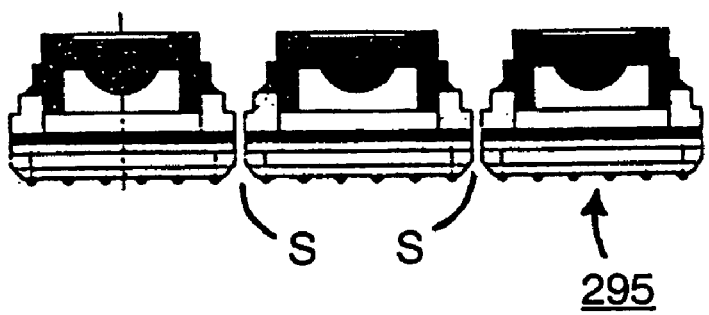
Figure 8E:
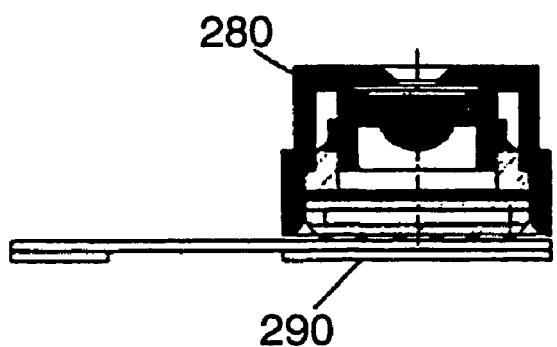

Now reference is made to FIGS. 8a to 8e, where several steps of the manufacturing process of a further embodiment of the present invention are illustrated. As can be seen from top of FIG. 8a, a micro-spacer layer 225 for the micro lenses (not illustrated) is mounted on the top side of a silicon wafer 215 comprising solid-state image sensors. In a next step a cover glass layer 235 is attached to the micro-spacer layer 225. Onto the cover glass layer 235 is an IR glass layer 236 mounted. Hereafter follows a further step for installing an optical system for the SSIS on wafer scale. On top of the IR glass layer 236 a wafer level lens holder or lens substrate 260 with cavities 262 for lenses is placed. This leads to FIG. 8b. Now referring to FIG. 8c, after the wafer level lens holder 260 has been glued to the IR glass layer 236, the lenses 270 are mounted into the cavities 262 of the wafer level lens holders 260. In FIG. 8d can be seen that the camera devices are separated after mounting of the lenses 270. In a next step such a camera device 295 can be installed onto a flex foil 290 for interconnection. Furthermore it may be advantageous to provide a sunshade 280. This sunshade 280 can be mounted before installation into an application or can be a part of a housing in which the camera device 295 can be installed.

FIGS. 9a to 9f show, in slice planes, several embodiments of an optical assembly according to the invention. The shown optical assemblies comprise a substrate having a plurality of lens elements. The optical assemblies are to be used in a manufacturing process of camera devices. This can be, for instance, a process similar to the process shown in FIG. 4. In such a process the optical assembly is preferably stacked to a base substrate comprising a plurality of image capturing elements corresponding to the lens elements. Preferably an adhesive is used to join the optical assembly and the base substrate. After the distance has been set between the respective lens elements and corresponding image capturing elements, and the lens substrate and the base substrate have been aligned relatively to each other, the adhesive is cured. This results in a wafer scale package similar to those shown in FIG. 3, FIG. 5, and FIG. 6. Alternatively, the optical assembly may be separated into individual lens modules which are stacked to individual image capturing elements.

The optical assemblies shown in FIGS. 9a to 9f are manufactured by means of a replication process. In such a process the lenses are usually made in whole or in part of polymers or curable liquids that are optically transparent. The lens substrate is usually made of an optically transparent material such as for example glass, plastic, resin, or quartz.

Figure 9A:
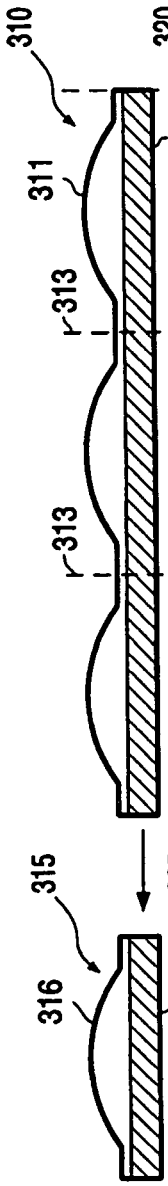
FIGS. 9a to 9f show, in slice planes, several embodiments of an optical assembly according to the invention.

FIG. 9a shows a cross section of an optical assembly 310 comprising a plurality of replication type positive or convex lens elements 311 formed on a lens substrate 312. The lens elements may be spherical, aspherical, or anamorphic. FIG. 9a also shows an individual lens module 315, comprising a replication type positive lens element 316 on a substrate 317, that is obtained by separating the optical assembly 310 along the lines 313. For separation, known methods, as for instance dicing can be used.

Figure 9B:

FIG. 9b shows a cross section of an optical assembly 320 comprising a plurality of replication type negative or concave lens elements 321 formed on a lens substrate 322. The lens elements may be spherical, aspherical, or anamorphic. FIG. 9b also shows an individual lens module 325, comprising a replication type negative lens element 326 on a substrate 327, that is obtained by separating the optical assembly 320 along the lines 323.

Figure 9C:

FIG. 9c shows a cross section of an optical assembly 330 comprising a plurality of positive-negative replication type lenses formed in through holes in the lens substrate 333. FIG. 9c also shows an individual lens module 335, comprising a replication type positive-negative lens element 336 formed in a through hole in a substrate 337, that is obtained by separating the optical assembly 330 along the lines 333. In this case the substrate 331, 337 does not need to be transparent. This may be advantageous in preventing unwanted reflection of light in a camera device in which the optical module is used. A further advantage of the optical assembly 330 and the optical module 335 is the by combining a positive lens and a negative lens in this way the resulting stack height may be reduced as compared with the optical module and the optical assembly shown in FIG. 9d.

Figure 9D:

FIG. 9d shows a cross section of an optical assembly 340 comprising a plurality of positive replication type lenses 341 and corresponding negative replication type lenses 342, both on opposite sides of a lens substrate 343. FIG. 9d also shows an individual lens module 345, comprising a replication type positive lens element 346 and a corresponding negative replication type lens element 348 formed on opposite sides of a lens substrate 347, that is obtained by separating the optical assembly 340 along the lines 343.

Figure 9E:
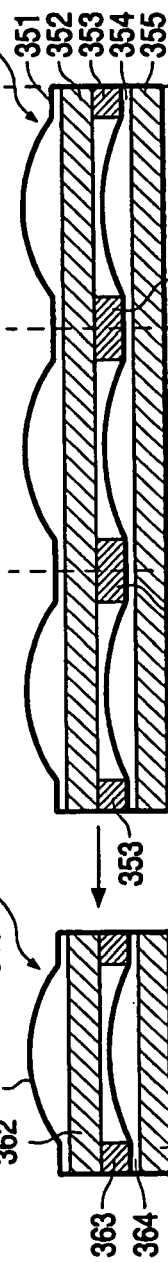

FIG. 9e shows a cross section of an optical assembly 350 comprising a plurality of first replication type positive lenses 351 formed on a first lens substrate 352, separated from a plurality of corresponding second replication type positive lenses 354 formed on a second lens substrate 355 by means of a spacer substrate 353 having through holes coaxially aligned with the optical axes through respective first lenses 351 and second lenses 354. By changing the thickness of the spacer substrate 353 the distance between the first lenses 351 and the corresponding second lenses 354 is changed. FIG. 9e also shows a lens module 360 that is obtained by separating the optical assembly 350 along the lines 356. It comprises a first positive replication type lens element 361 formed on a first lens substrate 362, which is separated from a corresponding second lens element 364 formed on a second lens substrate 364 by means of a spacer substrate 363 having a through hole coaxially aligned with the optical axis through the first lens element 361 and the second lens element 364.

Figure 9F:

FIG. 9f shows a cross section of an optical assembly 370 comprising a plurality of first replication type positive lenses 371 and a plurality of corresponding second replication type negative lenses 373 formed on opposite sides of a first lens substrate 372, joined with a plurality of corresponding third replication type positive lenses 374 formed on a second lens substrate 375 by means of a spacer layer of adhesive material (not shown). The respective first lenses 371, and corresponding second lenses 373 and third lenses 375 are aligned along the same optical axes. FIG. 9f also shows a lens module 380 that is obtained by separating the optical assembly 370 along the lines 376. It comprises a first positive replication type lens element 381 and a corresponding second negative replication type lens 383 formed on opposite sides of a first lens substrate 382, which is joined with a corresponding third positive replication type lens element 384 formed on a second lens substrate 384. The first lens element 381, the second lens element 383, and the third lens element 384 have a common optical axis. An advantage of combining the second lens element 383 and the third lens element 384 is that the need of a separate spacer substrate may be circumvented.

FIGS. 10a to 10d show, in slice planes, further embodiments of an optical assembly according to the invention. In a similar way as the optical assemblies shown in FIGS. 9a to 9e these optical assemblies are used in the manufacturing of a camera device. The main difference with the optical assemblies shown in FIGS. 9a to 9e is that the optical assemblies shown in FIGS. 10a to 10d comprise pre-shaped substrates that are optically transparent. Such pre-shaped substrates can be made for instance by hot-forming of a suitable transparent material. This involves heating the substrate material and forming it by using a mould. Suitable substrate materials are, for instance, glass, quartz, and suitable transparent plastics.

FIG. 10a shows an optical assembly 400 comprising a pre-shaped substrate 401 having a plurality of convexities 402. The convexity function as positive lens elements. To enhance their functioning as lens elements The convexities are covered by a correction layer of replication type material 403. FIG. 10a also shows an individual optical module 405 that is obtained by separating the optical assembly 400 along the lines 404.

FIG. 10b shows a pre-shaped substrate 411 comprising a plurality of positive replication type lens elements 412 formed on one side of a pre-shaped substrate 411 and a plurality of depressions or recessed areas 413 corresponding to the lens elements 411 at the other side of the substrate 411. An advantage of the shown pre-shaped substrate is that it integrates the functionality of a lens substrate, as shown in FIGS. 9a to 9e, and the functionality of a spacer layer. In this way the number of components making up a camera device may be reduced, resulting in a more simple assembly and/or a more camera device having a lens system that is more accurately aligned with the image capturing element. FIG. 10b also shows an individual optical module 415 that is obtained by separating the optical assembly 410 along the lines 414.

FIG. 10c shows an optical assembly 420 comprising a pre-shaped substrate 421 having a plurality of convexities 422 formed at one side of a substrate 421 and a plurality of depressions 424 formed at the other side of the substrate 421. The convexities 422 function as positive lens elements. To enhance their functioning as lens elements the convexities 422 are covered by a correction layer 423 of replication type material. Furthermore the depressions 424 are filled with a layer 425 of replication material formed as a negative lens. In this way both positive and negative lenses may be integrated in a single substrate. FIG. 10c also shows an individual optical module 427 that is obtained by separating the optical assembly 420 along the lines 424.

FIG. 10d shows an optical assembly 430 comprising a first pre-shaped substrate 431 having a plurality of first convexities 432 formed at one side of a first substrate 431 and a plurality of depressions 434 formed at the other side of the first substrate 431. The first convexities 432 function as positive lens elements. To enhance their functioning as lens elements the first convexities 432 are covered by a first correction layer 433 of replication type material. Furthermore the depressions 434 are filled with a second layer 435 of replication material formed as a negative lens. The optical assembly 430 further comprises a second pre-shaped substrate 436, joined with the first pre-formed substrate 431, having a plurality of second convexities 437 formed at a side opposing the depressions 434 of the first substrate 431 and corresponding to the depressions 434. The second convexities 437 function as positive lens elements. To enhance their functioning as lens elements the second convexities 437 are covered with a third correction layer 438 of replication material. An advantage of the shown first pre-shaped substrate 431 is that it integrates the functionality of a lens substrate and the functionality of a spacer layer. FIG. 10d also shows an individual optical module 440 that is obtained by separating the optical assembly 430 along the lines 439.

The embodiments of the present invention described herein are intended to be taken in an illustrative and not a limiting sense. Various modifications may be made to these embodiments by those skilled in the art without departing from the scope of the present invention as defined in the appended claims.

For instance wafer diameters and other dimensions mentioned in the discussion of the embodiments may be changed. The same holds for the type of image capturing elements applied.

Furthermore, although above mostly dicing or sawing is mentioned as a suitable technique to separate wafer scale packages or optical assemblies according to the invention, other known techniques may be applied, for instance, scribing, laser cutting, etching, or breaking.

The invention claimed is:

1. A camera device comprising an image capturing element, a first lens substrate for carrying a first lens element, wherein said first lens element projects an object on the image capturing element, a spacer located between the first lens substrate and the image capturing element, wherein the spacer comprises first and second adhesive layers, wherein the adhesive layers each comprises one of a ultra-violet curing resin and thermo-hardening resin, and a glass spacer substrate for maintaining a predetermined distance between the first lens substrate and the image capturing element, wherein said spacer substrate is adhered to said image capturing element by means of said first adhesive layer, wherein a second lens substrate for carrying a second lens element is stacked on said first lens substrate, aligned along the main optical axis through the second lens element, first lens element, spacer substrate and the image capturing element, wherein the spacer substrate comprises a hole coaxially positioned relative to a main optical axis of the lens element.

2. A camera device according to claim 1, wherein an adhesive layer is present between the second lens substrate and the first lens substrate.

3. A camera device according to claim 1, wherein said second lens substrate further comprises a second spacer substrate, wherein said second spacer substrate is adhered to said first lens substrate through an adhesive layer.

4. A camera device according to claim 3, wherein said second lens substrate is adhered to said second spacer substrate through an adhesive layer.

5. A camera device as claimed in claim 3, wherein the adhesive layer adhering said second spacer substrate has the shape of a rim outside a projection of the hole on the second spacer substrate coaxially positioned relative to a main optical axis of the second lens element.

6. A camera device as claimed in claim 1, wherein each said adhesive layer comprises an ultra-violet curing resin.

7. A camera device as claimed in claim 1, wherein each said adhesive layer comprises a thermo-hardening resin.

8. A camera device as claimed in claim 1, wherein the side of the hole is provided with an anti-reflection layer.

9. A camera device as claimed in claim 1, wherein at least one of the lens elements is of a replication type.

10. A camera device as claimed in claim 1, wherein at least one of the lens elements is formed as a convexity in the lens substrate.

11. A camera device as claimed in claim 1, wherein at least one of the lens elements is formed as a concavity in the lens substrate.

12. A camera device as claimed in claim 1, wherein the lens substrate is provided with a through hole whereby at least one of the lens elements is located within the through hole.

13. A camera device as claimed in claim 1, wherein the lens substrate is provided with an infra-red reflecting layer.

14. A camera device as claimed in claim 1, wherein the lens substrate is provided with an anti-reflection layer.

15. A camera device as claimed in claim 1, wherein:
at least one of said first lens element and said second lens element is formed integrally with the respective one of said first lens substrate and said second lens substrate.

16. A camera device as claimed in claim 1, wherein:
said first lens element is formed integrally with said first lens substrate, and said second lens element is formed integrally with said second lens substrate.

* * * * *